United States Patent
Korta et al.

(10) Patent No.: US 12,144,144 B2
(45) Date of Patent: Nov. 12, 2024

(54) COOLING DEVICE FOR A VEHICLE ELECTRONIC CONTROL UNIT AND CONTROLLER FOR OPERATING THE SAME

(71) Applicant: Aptiv Technologies AG, Schaffhausen (CH)

(72) Inventors: Jakub Korta, Dublin (IE); Klaus Kaufmann, Dublin (IE)

(73) Assignee: Aptiv Technologies AG, Schaffhausen (CH)

(*) Notice: Subject to any disclaimer, the term of this patent is extended or adjusted under 35 U.S.C. 154(b) by 351 days.

(21) Appl. No.: 17/462,907

(22) Filed: Aug. 31, 2021

(65) Prior Publication Data

US 2022/0071053 A1 Mar. 3, 2022

(30) Foreign Application Priority Data

Sep. 1, 2020 (GB) ..................................... 2013681

(51) Int. Cl.
*H05K 7/20* (2006.01)

(52) U.S. Cl.
CPC ..... *H05K 7/20209* (2013.01); *H05K 7/20154* (2013.01); *H05K 7/20409* (2013.01); *H05K 7/20863* (2013.01)

(58) Field of Classification Search
CPC ........... H05K 7/20209; H05K 7/20154; H05K 7/20409; H05K 7/20863; H05K 7/2039; H05K 5/0217; H05K 7/20136; H05K 7/20854
See application file for complete search history.

(56) References Cited

U.S. PATENT DOCUMENTS

| | | |
|---|---|---|
| 5,638,895 A | 6/1997 | Dodson |
| 5,787,971 A | 8/1998 | Dodson |
| 5,953,209 A | 9/1999 | Chiu |
| 6,172,416 B1 | 1/2001 | Miyahara et al. |
| 6,407,925 B1 * | 6/2002 | Kobayashi .......... H05K 5/0052 361/752 |

(Continued)

FOREIGN PATENT DOCUMENTS

| | | |
|---|---|---|
| CN | 201895566 U | 7/2011 |
| DE | 10062534 | 7/2001 |

(Continued)

OTHER PUBLICATIONS

"Extended European Search Report", EP Application No. 21186813.8, Jan. 24, 2022, 8 pages.

(Continued)

*Primary Examiner* — Kidest Bahta
(74) *Attorney, Agent, or Firm* — Harness, Dickey & Pierce, P.L.C.

(57) ABSTRACT

A cooling device for a vehicle electronic control unit, ECU. The cooling device includes a casing for covering the ECU and having a heat absorbing face for absorbing heat from components of the ECU and a heat dissipating face for dissipating absorbed heat. A plurality of fans are mounted to the heat dissipating face and are arranged to direct airflow over respective regions of the heat dissipating face. The fans are independently controllable for being driven at different speeds to vary the cooling of the respective regions of the heat dissipating face.

20 Claims, 4 Drawing Sheets

(56) References Cited

U.S. PATENT DOCUMENTS

| | | |
|---|---|---|
| 6,463,891 B2 | 10/2002 | Algrain et al. |
| 10,426,063 B2 | 9/2019 | North et al. |
| 10,450,939 B2 | 10/2019 | West et al. |
| 2001/0029907 A1* | 10/2001 | Algrain .................. F01P 7/044 123/41.31 |
| 2006/0139880 A1* | 6/2006 | Tate ........................ G06F 1/20 257/E23.088 |
| 2009/0002943 A1 | 1/2009 | Peron et al. |
| 2009/0116189 A1 | 5/2009 | Chang et al. |
| 2010/0078154 A1* | 4/2010 | Li ........................ H01L 23/467 165/104.31 |
| 2013/0171006 A1* | 7/2013 | Ma ..................... H05K 7/20836 165/282 |
| 2018/0263106 A1* | 9/2018 | Feismann ................. H02K 7/14 |
| 2018/0297445 A1* | 10/2018 | Onishi ..................... B60H 1/12 |
| 2018/0307091 A1* | 10/2018 | Zhang ............... G02F 1/133385 |
| 2019/0045670 A1 | 2/2019 | Rabeyrin |

FOREIGN PATENT DOCUMENTS

| | | |
|---|---|---|
| DE | 60221235 | 4/2008 |
| DE | 202020103473 U1 | 7/2020 |
| EP | 3373716 A1 | 9/2018 |

OTHER PUBLICATIONS

"Search Report", GB Application No. 2013681.8, Feb. 1, 2021, 4 pages.

"Fan control experiment," Huo Kou and Yong Shi WO Education Society, website: www.jingjilei.cn/n/dsrqw/book/base/14511589/f967872dc9094ec0b94ea1c79382963c/6314bf8fc7e7ed097302d2410b38e08f.shtml?dm=-845579977&, dated Jun. 26, 2024.

* cited by examiner

COOLING DEVICE FOR A VEHICLE ELECTRONIC CONTROL UNIT AND CONTROLLER FOR OPERATING THE SAME

CROSS-REFERENCE TO RELATED APPLICATION

This application claims priority to GB Patent Application Number 2013681.8, filed Sep. 1, 2020, the disclosure of which is hereby incorporated by reference in its entirety herein.

INTRODUCTION

The present disclosure relates to a cooling device for cooling a plurality of electronic components mounted on a vehicle electronic control unit (ECU). The present disclosure is particularly relevant to a fan cooling system for automotive applications and most particularly to multi domain controllers (MDCs).

BACKGROUND

Some electronics components get hot during operation, which can subsequently compromise their function or lead to component damage. As such, it is common to fit cooling devices to electronic circuitry to maintain their operating temperature within an acceptable tolerance. These cooling systems are particularly important in automotive applications because the Multi-domain controllers (MDC) and other types of electronic control units (ECU) used in modern vehicles perform critical vehicle control and safety functions. This is especially true in vehicles having autonomous driving capabilities where processing demands of electronic components are high and maintaining operating integrity is particularly essential.

Depending on the level of dissipated electrical power, cooling systems for cooling active components typically rely on forced-air or forced-liquid cooling to achieve the required cooling performance for maintaining an acceptable operating temperature. However, electronic systems in automotive applications also have further specific requirements in terms of electromagnetic shielding, and dust and moisture protection. As such, ECU devices will typically need to be encapsulated in a casing which provides electromagnetic, water and dust protection, but consequently also prevents direct contact between the ECU and cooling liquids or gases. As such, conventional ECU cooling systems will normally employ a combination of passive heat transfer through the housing to the ambient, along with a liquid cooling circuit to provide high efficiency cooling through the housing to active components.

Forced-air cooling systems are rarely used for ECU applications. Although such forced-air systems potentially offer advantages in terms of reduced complexity, as well as cost and weight savings, conventional systems have a number of disadvantages which have prevented their wider adoption. For example, systems have been proposed which employ an axial or radial fan attached on the ECU for moving air over the housing surface. However, a fan capable of generating sufficient cooling airflow is relatively large and hence increases the overall dimensions of ECU assembly. At the same time, driving at higher fan speeds leads to increased noise and, in the event that the fan malfunctions or is damaged by the intrusion of an object, cooling may be stopped altogether. There are also issues associated with the evenness of the air stream generated by a fan. For instance, large fans typically have a large central hub to support the blades, which results in a low airflow region directly below the hub. At the same time, it is typical to mount a fan centrally over an ECU's housing, which often locates this low airflow region over or adjacent to the ECU's main System-on-a-Chip component. As such, a critical component of the ECU would be subjected to ineffective cooling.

There therefore remains a need in automotive industry for an improved forced-air cooling device for cooling an ECU.

SUMMARY

The present disclosure concerns a cooling device and controller for a cooling device for cooling a vehicle ECU. The present disclosure particularly concerns a cooling device and controller for a cooling device for cooling a multi domain controller (MDC). For example, the cooling device may be for use with an autonomous driving MDC.

According to a first aspect, there is provided a cooling device for a vehicle electronic control unit, ECU, including: a casing for covering the ECU and having a heat absorbing face for absorbing heat from components of the ECU and a heat dissipating face for dissipating absorbed heat; and a plurality of fans mounted to the heat dissipating face and arranged for directing airflow over respective regions of the heat dissipating face, wherein the fans are independently controllable for being driven at different speeds to vary the cooling of the respective regions of the heat dissipating face.

In this way, a grid-array of smaller independent cooling fans may be used for cooling an ECU, rather than a single large fan. This not only allows for improved cooling efficiency, but also provides for enhanced reliability by allowing other fans in the array to compensate in the event of a fan malfunction.

In embodiments, the cooling device further comprises a plurality of temperature sensors for determining a temperature associated with the respective regions of the heat dissipating face.

In embodiments, the plurality of temperature sensors are provided on the heat absorbing face of the casing. In other embodiments, the temperature sensors may be integrated into the ECU electronics. The temperature sensors may be thermistors.

In embodiments, the cooling device further comprises fan speed sensors for measuring the fan speed of individual ones of the plurality of fans. In this way, feedback of the actual fan rotation speed may be provided for diagnostic or fault detection purposes.

In embodiments, the cooling device further comprises a controller for controlling the fans. In embodiments, the controller may be integrated into the ECU.

In embodiments, the controller is configured for controlling the fans based on at least determined temperature values associated with the respective regions of the heat dissipating face.

In embodiments, the determined temperature values are based on measured temperatures at the respective regions of the heat dissipating face. In embodiments, the determined temperature values are based on temperature sensor measurements. In other embodiments, the temperature values may be determined based on predicted temperature values. For example, temperature values may be estimated based on the operating state of the ECU.

In embodiments, the controller is configured for controlling the fans based on at least measured fan speed of individual ones of the plurality of fans.

In embodiments, the controller is configured for controlling the plurality of fans to compensate for performance differences between the fans.

In embodiments, the plurality of fans comprises a backup fan activatable for compensating for a drop in performance of one of the other plurality of fans.

In embodiments, the heat dissipating face comprises a plurality of cooling fins for directing airflow from the plurality of fans. The cooling fins may thereby act to dissipate heat transferred through the casing from the ECU. The cooling fins may be arranged in clusters defining cooling regions of the casing. The cooling regions may be linked by air pathways to allow airflow generated by the fans to flow between regions.

In embodiments, the heat dissipating face comprises a plurality of mounting formations to which the plurality of fans are mounted, wherein the mounting formations are configured for locating the fans over regions of the heat dissipating face associated with active components of the ECU.

According to a second aspect, there is provided an electronic control unit, ECU, assembly for a vehicle, including: an ECU having a plurality of components mounted to a circuit board; a casing for covering the ECU and having a heat absorbing face for absorbing heat from the components and a heat dissipating face for dissipating absorbed heat; a plurality of fans mounted to the heat dissipating face and arranged for directing airflow over respective regions of the heat dissipating face; and a controller for independently controlling the fans to drive them at different speeds for varying the cooling of the respective regions of the heat dissipating face.

According to a third aspect, there is provided a controller for controlling a cooling device according to any of the above statements, the controller including: a temperature determination module for determining temperature values associated with the respective regions of the heat dissipating face; a control signal module for generating individual control signals for the plurality of fans for driving each fan at a speed for cooling the respective region of the heat dissipating face.

According to a fourth aspect, there is provided method for controlling a cooling device according to any of the above statements, the method including: determining temperature values associated with the respective regions of the heat dissipating face; and generating individual control signals for the plurality of fans for driving each fan at a speed for cooling the respective region of the heat dissipating face.

According to a fifth aspect, there is provided software including instructions for implementing the above method. The software may be stored on a non-transitory computer readable medium.

BRIEF DESCRIPTION OF THE DRAWINGS

Illustrative embodiments will now be described with reference to the accompanying drawings in which.

DETAILED DESCRIPTION

Figure 1:
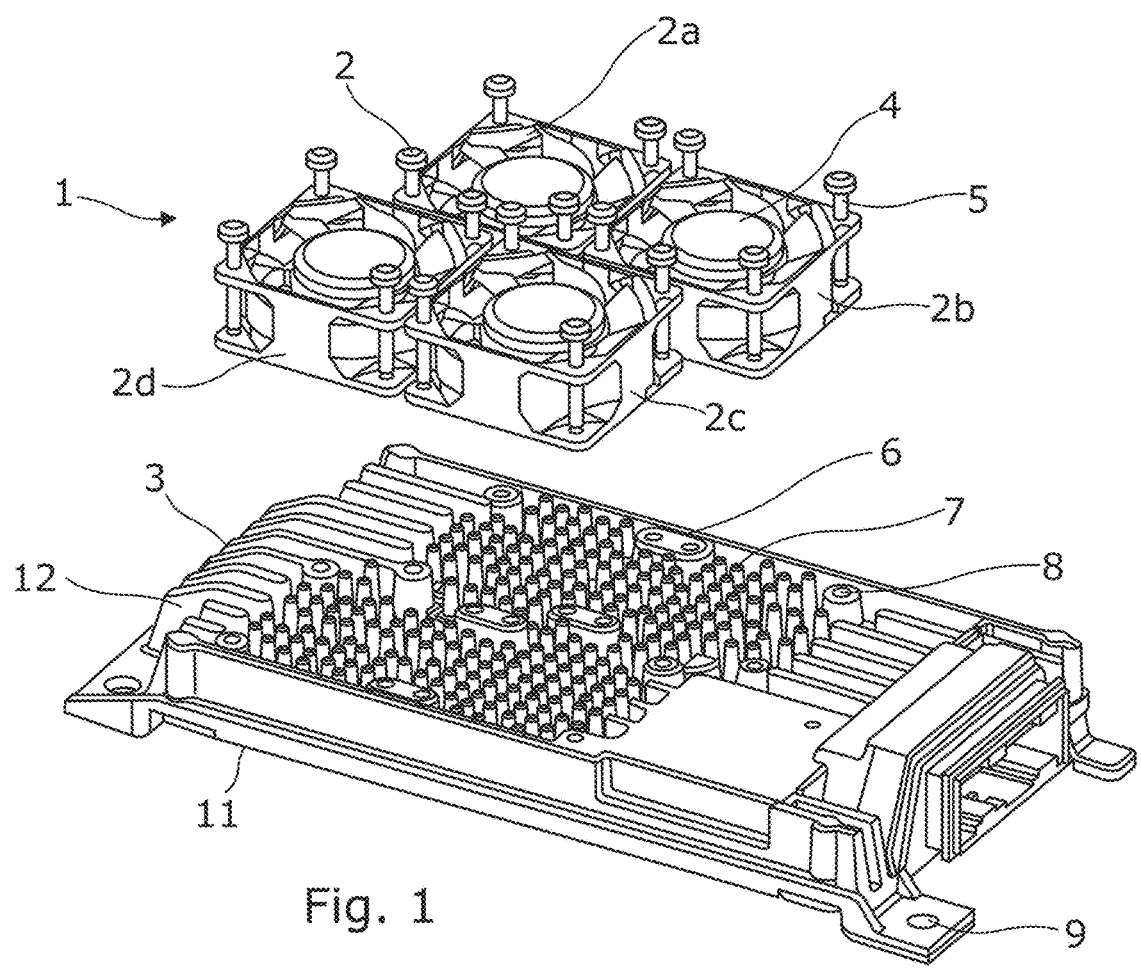
FIG. 1 shows an isometric view of a cooling device, with the casing and fan array separated, according to a first embodiment.

FIG. 1 shows an isometric view of a cooling device 1 according to a first embodiment. The cooling device 1 comprises a casing 3 which fits over a vehicle Electronic Control Unit (ECU) and fan array 2, which is mounted to the upper surface 6 of the casing 3 when assembled, as shown in FIG. 2.

In this embodiment, the fan array 2 comprises four fans $2a,2b,2c,2d$. Each fan $2a,2b,2c,2d$ comprises a plurality of blades connected to a central hub 4 which is driven by a rotor and is independently controllable for allowing each fan to be driven different speeds. Each fan further comprises a rotor speed sensor which generates a feedback sensor signal for indicting the respective fan's speed. When activated, rotation of the fan's hub 4 causes air to flow over the upper surface 6 of the casing 3 once the fan array 2 is mounted to the casing 3. In this embodiment, the fans $2a,2b,2c,2d$ are configured to blow air down onto the upper surface 6 of the casing 3 when driven. In other embodiments, the airflow may be reversed such that the fans $2a,2b,2c,2d$ draw air from the upper surface 6.

Figure 2:
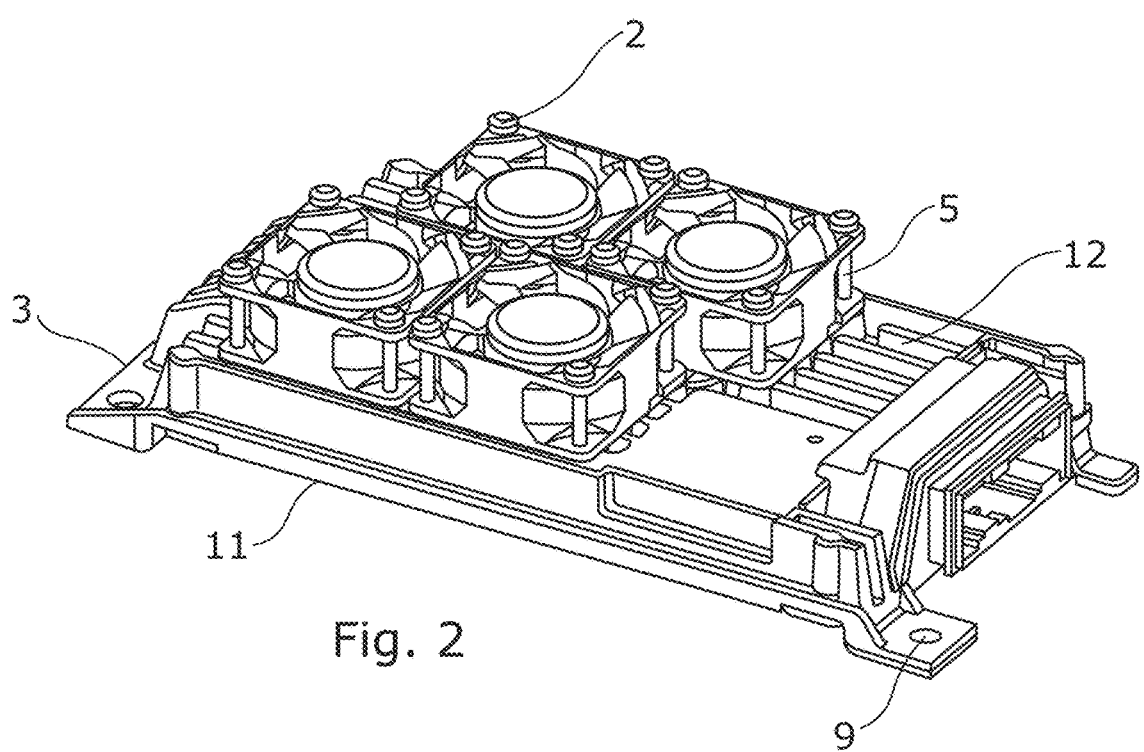
FIG. 2 shows an isometric view of the cooling device shown in FIG. 1, with the fan array connected to the casing.
Figure 3:
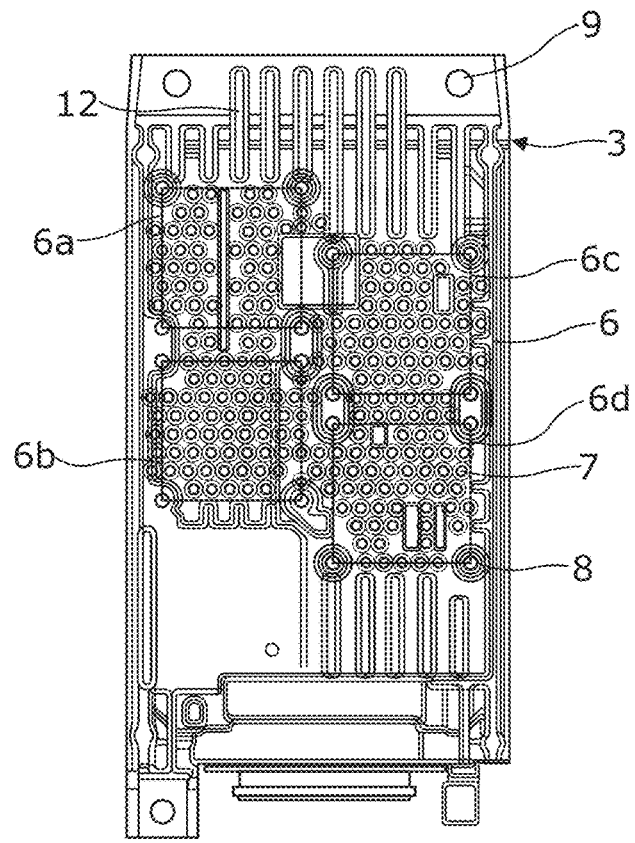
FIG. 3 shows a top view of the casing shown in FIG. 1.

The upper surface 6 of the casing 3 comprises a plurality of mounting formations 8 to which the fans 2 are seated and fixed in place using screws 5, as shown in FIG. 2. As shown in FIGS. 1 and 3, the upper surface 6 comprises a plurality of heat dissipating fins 7 which are located beneath the fans $2a,2b,2c,2d$ when they are mounted to the casing 3. As such, airflow driven by the fans is forced over and around the heat dissipating fins 7 for transferring heat from the fins 7 into the air. Linear fins 12 are provided either side of the heat dissipating fins 7 to form airflow paths for feeding or exhausting air from the heat dissipating fins 7, depending on the driving direction of the fans 2.

The casing 3 is formed of a thermally conductive material, such as a metal or metal alloy, and further comprises a coupling 9 for fixture to the ECU. For example, the ECU's circuit board may be mounted to a base plate which connects to the couplings 9 to form a housing around the ECU. Once mounted to the circuit board, the casing 3 provides a protective cover for the ECU. At the same time, the bottom surface 11 of the casing 3 faces the electronic components on the ECU circuit board and acts to absorb heat therefrom. This absorbed heat is then conducted to the upper surface 6, from where it may be dissipated.

In this connection, once the fans are mounted to their respective mounting formations 8, they define four cooling regions $6a,6b,6c,6d$ on the upper surface 6 of the casing 3, as shown in FIG. 3. These cooling regions $6a,6b,6c,6d$ comprise a dense cluster of heat dissipating fins 7 and provide regions of enhanced cooling during use. That is, although the whole of the upper surface 6 of the casing 3 may dissipate heat, heat dissipation will be particularly effective in the cooling regions $6a,6b,6c,6d$ beneath the fans $2a,2b,2c,2d$ due to the large surface area of the heat dissipating fins 7 and the airflow being driven by the fans. The cooling regions $6a,6b,6c,6d$ are further connected to one another by airflow pathways around their respective heat dissipating fins 7 for allowing air to flow between them.

Figure 4:
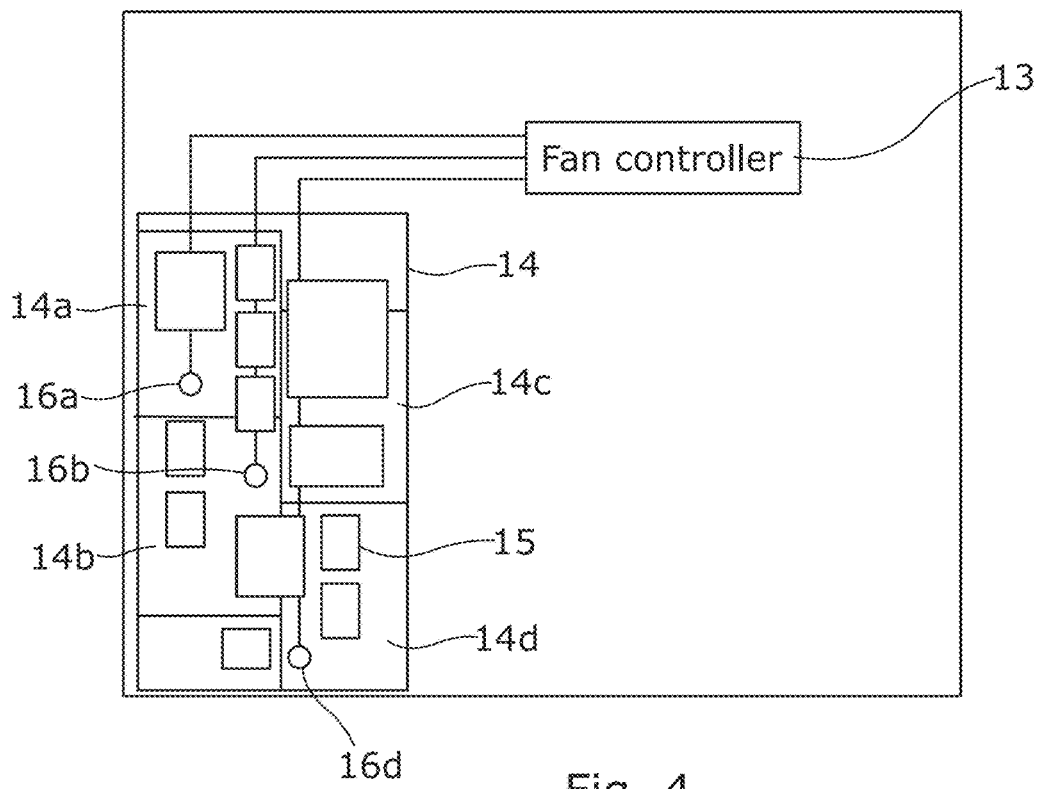
FIG. 4 shows a schematic top view of an ECU circuit board relative to the temperature sensors of the cooling device of the first embodiment.

FIG. 4 shows a schematic top view of the ECU circuit board 4 and the temperature sensors 16 relative to this. In this embodiment, three temperature sensors $16a,16,16d$ are provided to transmit temperature measurements to the fan controller 13, which then controls the fan array 2 in response thereto. The three temperature sensors 16a,16,16d are located on the bottom surface 11 of the casing 3 such that they align with defined positions on the circuit board 14 when the casing 3 is fitted. The cooling regions 6a,6b,6c,6d of the casing 3 define four circuit regions 14a,14b,14c,14d on the circuit board 14. The three temperature sensors 16a,16b,16d are configured to approximately align with three respective circuit regions 14a,14b,14d. The components 15 located within these circuit regions 14a,14b,14d are active components which get hot during operation and require active cooling. As such, the three temperature sensors 16a,16b,16d may detect temperature increases in these active components.

In this embodiment, the remaining circuit region 14c without an associated temperature sensor comprises components which are passive or less sensitive to higher operating temperatures. However, the associated cooling region 6c and fan 2c provides a redundancy in the event that one of the other fans 2a,2b,2d loses performance. That is, the fan 2c may provide a back up to enhance cooling within cooling region 6c, which may then compensate for a loss of cooling efficiency in an adjacent cooling region 6a,6b,6d. The heat dissipating fins 7 within cooling region 6c may also be configured to direct airflow from the fan 2c to the adjacent cooling regions 6a,6b,6d. Accordingly, the operation of active components 15 within the associated circuit regions 14a,14b,14d may be maintained event if their associated fans 2a,2b,2d fail or otherwise lose performance.

Figure 5:
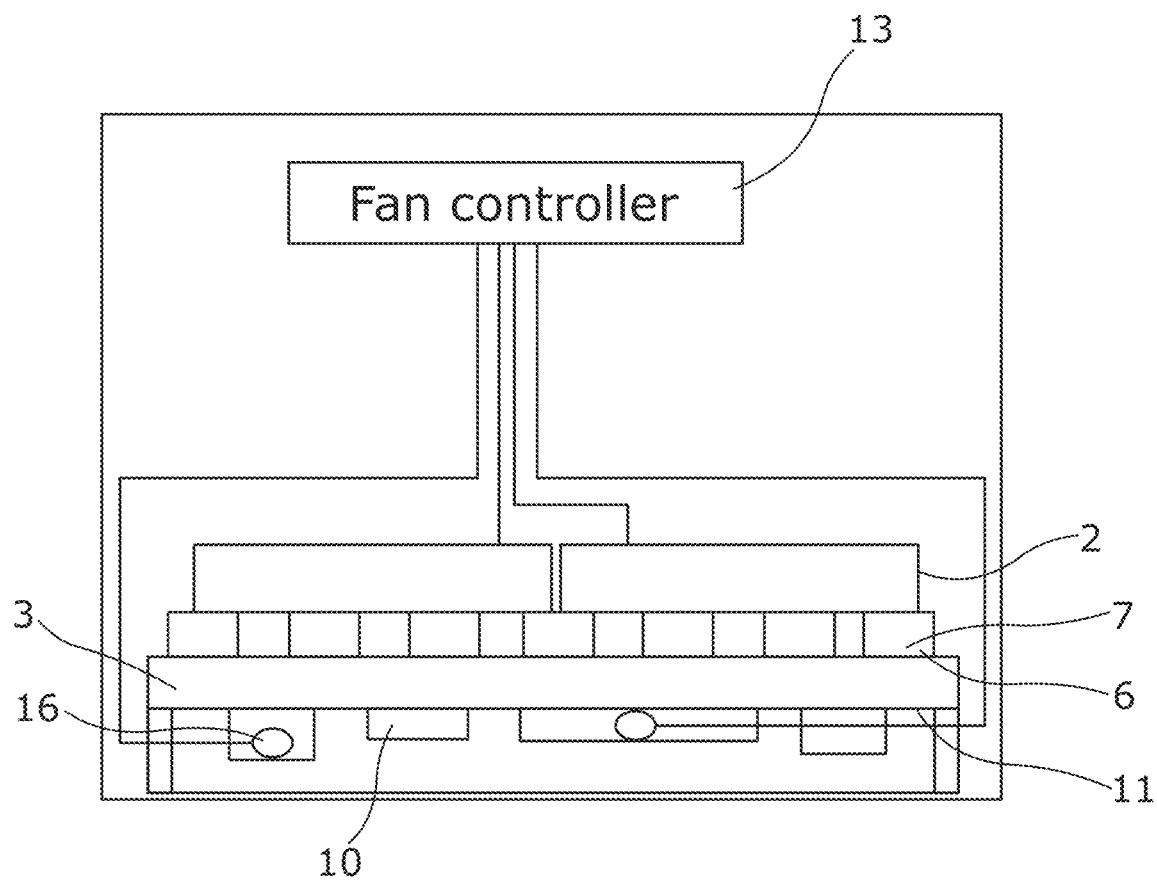
FIG. 5 shows a schematic cross-sectional view of the cooling device of the first embodiment.

FIG. 5 shows a schematic cross-sectional view of the cooling device 1. In this embodiment, the bottom surface 11 of the casing 3 is provided with pedestals 10 which project down toward the ECU circuit board to facilitate heat transfer. The pedestals 10 may also mate with the top surfaces of components 15. In this embodiment, the temperature sensors 16 are located within the pedestals 10 and feedback to the fan controller 13. In turn, the fan controller 13 drives the fans within the fan array 2, which are seated over the heat dissipating fins 7. At the same time, the fans provide fan speed feedback to the controller 13 based on the detected fan speed.

Figure 6:
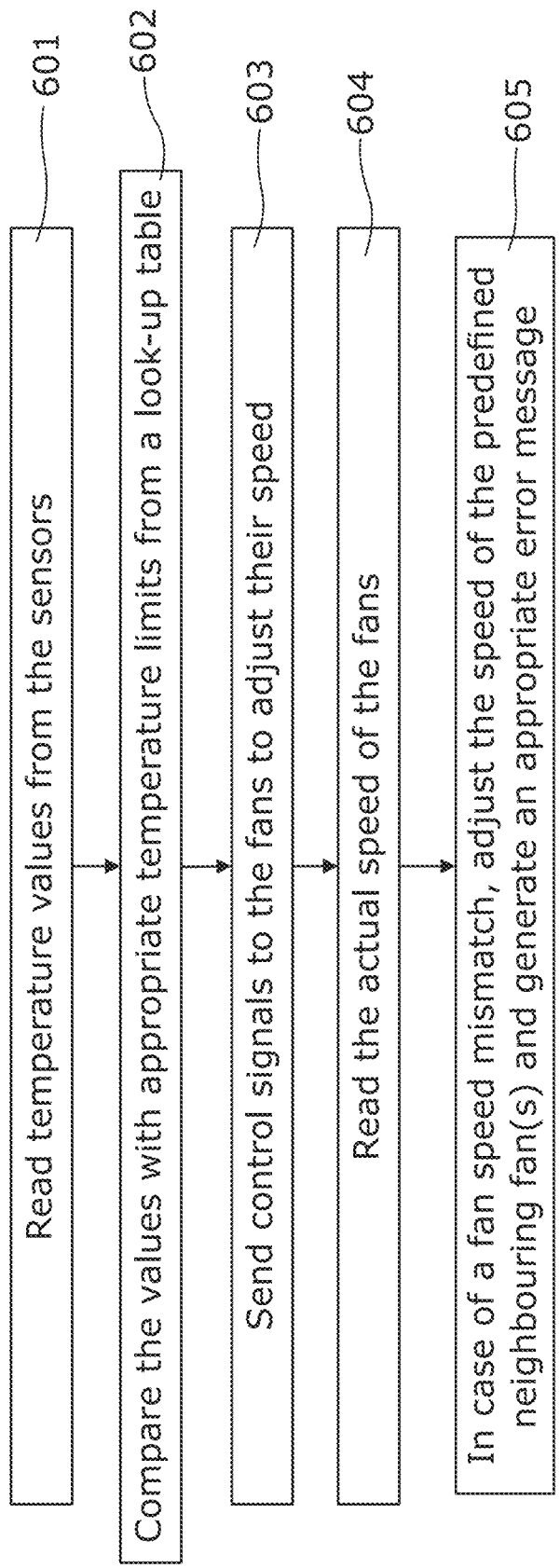
FIG. 6 shows a flow diagram of the control algorithm employed by the fan controller.

FIG. 6 shows a flow diagram of the control algorithm employed by the fan controller 13 during normal operation. Initially, the fan array 2 may be activated so that all the fans are set to a default speed. In step 601, the controller 13 reads the temperature values at each of the temperature sensors 16. In step 602, the detected temperature values are compared with threshold values stored in a look-up table within the controller's memory, or may otherwise be analysed according controller software algorithms. In step 603, the controller may then independently adjust each fan's speed according to the optimised settings specified in the look-up table. For example, if components within circuit region 14b are getting hot, the speed of fan 2b may be accelerated. Equally, fan 2c, which is mounted above the circuit region 14c that requires no cooling, can be decreased to zero.

In step 604, the fan controller 13 may read the fan speed sensor values and compare the actual fan speed with the driven values dictated in the look-up table. If the controller 13 determines that the actual fan speed is lower than desired, this may be logged as a potential fan malfunction. In step 605, where a malfunctioning fan is detected, the redundant fan 2c may be activated or its speed increased to compensate. For example, if fan 2b malfunctions, adjacent fan 2c may be activated to enhance cooling through cooling region 6c. The controller may also increase the speed of the other adjacent fans 2a and 2d to further compensate and maintain overall cooling performance. The controller 13 may additionally generate and store an error message identifying the fan malfunction for maintenance purposes.

As discussed above, in this embodiment, the controller 13 may determine adjustments to fan speed based on the current temperature readings provided by temperature sensors 16. As such, the speed of each fan 2a,2b,2c,2d may be increased, decreased or maintained to achieve the desired cooling rate. In other embodiments, the controller 13 may also or alternatively utilise a predictive algorithm based on the current state of the ECU. For example, when the activity state of the ECU increases due to processing demands, the predicted temperature values may be used by the controller to determine fan speed settings. These predicted temperature values may be based, for example, on historical data or pre-defined in a look-up table. As such, in response to a change in state of ECU components, the controller 13 may pre-emptively increase cooling within relevant cooling regions 14a,14b,14c,14d of the circuit board before these regions reach elevated temperatures. This feature may help to mitigate the risk of temperature peaks on crucial components, thereby improving the thermal reliability of the ECU system and reducing aging by operation at lower temperatures.

Accordingly, with the above described embodiments, two or more smaller fans are utilised in a fan-grid array to provide cooling, rather than a single large fan. As such, the fans may be located to focus their airflow on locations of the ECU casing which particularly require cooling, for instance directly above circuit hot spots. The fan speeds may therefore be controlled according to the actual cooling needs of the respective region of the ECU circuit. At the same time, the use of the fan-grid array may minimise the low air flow regions associated with larger fans, thereby allowing for improved cooling uniformity overall.

The use of smaller fans also provides for a smaller assembly size and lower noise generation. For instance, fans with a smaller diameter are available with a lower fan height, which allows the overall height of the ECU package to be reduced. A higher air flow volume can be created compared to a single larger fan, thereby allowing operation at relatively lower fan speeds. Equally, the focused cooling may allow one or more of the fans to be deactivated or run at very low speeds. These factors help to minimise the noise that would otherwise be generated at higher fan speeds.

Finally, the built-in redundancy provided by having multiple fans allows for enhanced robustness towards malfunction. Faults are also less likely because, not only may individual fans be deactivated when non-needed which allows their mechanical lifespan to be preserved, but the smaller fans also have smaller blade separations. This thereby reduces the chance of objects from blocking the fan. As such, the cooling device may provide for increased ECU reliability.

It will be understood that the embodiments illustrated above show applications only for the purposes of illustration. In practice, embodiments may be applied to many different configurations, the detailed embodiments being straightforward for those skilled in the art to implement.

For example, although in the above embodiment an independent fan controller is described, it will be understood that the fan control algorithm may be implemented using the ECU. For example, an ECU assembly may be provided, which includes both the ECU and the cooling device, with the controller being integrated into the ECU electronics. Equally, although the temperature sensors have been described as independent sensors integrated into the casing, internal sensors within the ECU components may be used.

On the casing itself, although the heat dissipating fins have been illustrated as pin projections, it will be understood that different fin configurations are also possible. For example, a number of higher pin fins may be additional provided which extend above the tops of the fans such that the fans are seated between the higher fins. This may thereby provide some mechanical impact protection for the fans.

What is claimed is:

1. A cooling device for a vehicle electronic control unit (ECU) comprising:
    a casing for covering the ECU, the casing comprising:
        a heat absorbing face configured to absorb heat from components of the ECU; and
        a heat dissipating face configured to dissipate absorbed heat from the heat absorbing face; and
    a plurality of fans mounted to the heat dissipating face and arranged to direct airflow over respective regions of the heat dissipating face, the fans being independently controllable to be driven at different speeds to vary cooling of the respective regions of the heat dissipating face.

2. The cooling device of claim 1, the cooling device further comprising a plurality of temperature sensors configured to determine a temperature associated with the respective regions of the heat dissipating face.

3. The cooling device of claim 2, wherein the plurality of temperature sensors are provided on the heat absorbing face of the casing.

4. The cooling device of claim 1, the cooling device further comprising a plurality of fan speed sensors configured to measure a fan speed of individual ones of the plurality of fans.

5. The cooling device of claim 1, the cooling device further comprising a controller configured to control the plurality of fans.

6. The cooling device of claim 5, wherein the controller is configured to control the plurality of fans based on determined temperature values associated with the respective regions of the heat dissipating face.

7. The cooling device of claim 6, wherein the determined temperature values are based on measured temperatures at the respective regions of the heat dissipating face.

8. The cooling device of claim 7, wherein the determined temperature values are based on temperature sensor measurements.

9. The cooling device of claim 5, wherein the controller is configured to control the plurality of fans based on measured fan speed of the plurality of fans.

10. The cooling device of claim 5, wherein the controller is configured to control the plurality of fans to compensate for performance differences between the fans.

11. The cooling device of claim 1, wherein the plurality of fans comprises a backup fan activatable for compensating for a drop in performance of one of the other plurality of fans.

12. The cooling device of claim 1, wherein the heat dissipating face comprises a plurality of cooling fins configured to direct airflow from the plurality of fans.

13. The cooling device of claim 1, wherein the heat dissipating face comprises a plurality of mounting formations to which the plurality of fans are mounted, wherein the mounting formations are configured to locate the fans over regions of the heat dissipating face associated with active components of the ECU.

14. An electronic control unit (ECU) assembly for a vehicle, the ECU assembly comprising:
    an ECU having a plurality of components mounted to a circuit board;
    a casing for covering the ECU that comprises:
        a heat absorbing face configured to absorb heat from the components mounted to the circuit board; and
        a heat dissipating face configured to dissipate absorbed heat from the heat absorbing face;
    a plurality of fans mounted to the heat dissipating face and arranged to direct airflow over respective regions of the heat dissipating face; and
    a controller configured to independently control the plurality of fans to drive them at different speeds for varying cooling of the respective regions of the heat dissipating face.

15. The ECU assembly of claim 14, the ECU assembly further comprising a plurality of temperature sensors configured to determine a temperature value associated with the respective regions of the heat dissipating face.

16. The ECU assembly of claim 15, wherein the controller is configured to control the plurality of fans based on determined temperature values associated with the respective regions of the heat dissipating face.

17. The ECU assembly of claim 14, wherein the controller is configured to control the plurality of fans based on measured fan speed of the plurality of fans.

18. The ECU assembly of claim 14, wherein the controller is configured to control the plurality of fans to compensate for performance differences between the fans.

19. The ECU assembly of claim 14, wherein the heat dissipating face comprises a plurality of cooling fins configured to direct airflow from the plurality of fans.

20. A controller for controlling a cooling device, the controller being configured to:
    determine temperature values associated with respective regions of a heat dissipating face, the heat dissipating face being a part of a casing covering a vehicle electronic control unit (ECU) and configured to dissipate absorbed heat from a heat absorbing face of the casing, the heat absorbing face configured to absorb heat from components of the ECU; and
    generate individual control signals for a plurality of fans to drive each fan at a speed for cooling a respective region of the heat dissipating face, the plurality of fans mounted to the heat dissipating face and arranged to direct airflow over the respective regions of the heat dissipating face.

* * * * *